(12) United States Patent
Schreier et al.

(10) Patent No.: US 7,262,726 B2
(45) Date of Patent: Aug. 28, 2007

(54) QUADRATURE BANDPASS ΔΣ CONVERTER

(75) Inventors: Richard E. Schreier, North Andover, MA (US); Wenhua Yang, North Andover, MA (US); Hajime Shibata, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/445,413

(22) Filed: Jun. 1, 2006

(65) Prior Publication Data

US 2007/0035427 A1 Feb. 15, 2007

Related U.S. Application Data

(60) Provisional application No. 60/706,670, filed on Aug. 9, 2005, provisional application No. 60/706,671, filed on Aug. 9, 2005.

(51) Int. Cl.
*H03M 3/00* (2006.01)
(52) U.S. Cl. .................................... 341/143; 341/155
(58) Field of Classification Search ................ 341/143, 341/155
See application file for complete search history.

(56) References Cited

U.S. PATENT DOCUMENTS

| | | | |
|---|---|---|---|
| 5,500,645 A * | 3/1996 | Ribner et al. ............... | 341/143 |
| 5,608,400 A * | 3/1997 | Pellon ........................ | 341/143 |
| 5,673,044 A * | 9/1997 | Pellon ........................ | 341/143 |
| 5,729,230 A * | 3/1998 | Jensen et al. ............... | 341/143 |
| 6,225,928 B1 * | 5/2001 | Green ........................ | 341/143 |
| 6,396,428 B1 * | 5/2002 | Cheng ........................ | 341/143 |
| 6,414,615 B1 * | 7/2002 | Cheng ........................ | 341/143 |
| 6,538,588 B1 * | 3/2003 | Bazarjani .................... | 341/143 |
| 6,768,435 B2 * | 7/2004 | Xu ............................. | 341/143 |
| 6,943,715 B2 * | 9/2005 | Radja et al. ................ | 341/143 |
| 7,034,728 B2 * | 4/2006 | Luh et al. ................... | 341/143 |
| 2004/0021594 A1* | 2/2004 | Melanson .................. | 341/143 |
| 2005/0266805 A1* | 12/2005 | Jensen ........................ | 455/82 |

OTHER PUBLICATIONS

R.. Schreier and G. C. Teme, *Understanding Delta-Sigma Data Converters*, John Wiley & Sons, Hoboken, NJ, 2005, month unknown.
S. A. Jantzi, K. W. Martin and A. S. Sedra, "Quadrature bandpass ΔΣ modulation for digital radio," *IEEE Journal of Solid-State Circuits*, vol. 32, No. 12, pp. 1935-1950, Dec. 1997.

(Continued)

*Primary Examiner*—Jean Bruner Jeanglaude
(74) *Attorney, Agent, or Firm*—Iandiorio & Teska

(57) ABSTRACT

An improved quadrature bandpass ΔΣ converter includes a loop filter, an ADC responsive to the loop filter, and a first feedback DAC responsive to the ADC; a first summing circuit is responsive to the first DAC and an analog input for providing an input to the loop filter; a second feedback DAC is responsive to the ADC for providing an input to the loop filter; the loop filter includes a plurality of signal resonators, at least one image resonator, a second summing circuit, and a feed forward circuit connecting at least two of the resonators to the second summing circuit for reducing the quantization noise from the ADC; the image resonator is responsive to the second DAC for reducing the image quantization noise.

18 Claims, 7 Drawing Sheets

OTHER PUBLICATIONS

S. A. Jantzi, K. W. Martin and A. S. Sedra, "The effects of mismatch in complex bandpass ΔΣ modulators," *Proceedings of the 1996 IEEE International Symposium on Circuits and Systems*, vol. 1, pp. 227-230, May 1996.

R. H. M van Veldhoven, B. J. Minnis, H. A. Hegt and A. H. M. van Roermund, "A 3.3-mW ΔΣ modulator for UMTS in 0.1lJ.m CMOS with 70-dB dynamic range in 2-MHz bandwidth, " *IEEE Journal of Solid-State Circuits*, vol. SC-37, No. 12, pp. 1645-1652, Dec. 2002.

K. Philips, "A 4.4.mW 76dB complex ΔΣ ADC for bluetooth receivers," *IEEE International Solid-State Circuits Conference Digest of Technical Papers*, pp. 64-65, Feb. 2003.

F. Esfahani, P. Basedau, R. Ryter and R. Becker, "A fourth order continuous-time complex sigma-delta ADC for low-IF GSM and EDGE receivers," *IEEE Symposium on VLSI Circuits Digest of Technical Papers*, pp. 75-78, Jun. 2003.

P. M. Aziz, H. V. Sorensen and J. Van der Spiegel, "Multi band sigma delta analog to digital conversion," *IEEE International Conference on Acoustics, Speech, and Signal Processing*, vol. 3, pp. 249-252, Apr. 1994.

\* cited by examiner

QUADRATURE BANDPASS ΔΣ CONVERTER

RELATED APPLICATIONS

This application claims benefit of U.S. Provisional Application Ser. No. 60/706,670 filed Aug. 9, 2005 and 60/706,671 filed Aug. 9, 2005, both herein incorporated by this reference.

FIELD OF THE INVENTION

This invention relates to an improved quadrature bandpass ΔΣ converter.

BACKGROUND OF THE INVENTION

In ΔΣ converters, noise shaping is used to lower the quantization noise in the signal band. In quadrature ΔΣ bandpass converters, imperfect matching causes image noise to be reflected into the signal band and so it too must be addressed. In feedback ΔΣ quadrature converters, a cascade of signal resonators is followed by an image resonator which creates the image notch to address the reflected image noise problem. Recently, feed forward ΔΣ quadrature converters have been preferred because of superior dynamic range, lower power requirements and less signal distortion. However, attempts to apply the usual resonator ordering of the feedback architecture to the feed forward architecture have resulted in some problems. For example, the placement of the image resonator as the last resonator results in the converter being impractically sensitive to coefficient errors. This is so because in the feed forward approach the input to the image resonator is the output of the last signal resonator, and, the energy in this signal near the image frequency is small, owing to the accumulated attenuation of the signal resonators at the image frequency, whereas in the previous feedback approach the image frequency energy applied to the image resonator is not limited by propagation through the signal resonators. In the feedback approach, the energy at the signal frequency gets attenuated by the image resonator. However, since there is only one image resonator, the problem is less severe. Moving the image resonator to an earlier stage of the cascaded resonators increases the impact of the quadrature errors on subsequent stages.

SUMMARY OF THE INVENTION

It is therefore an object of this invention to provide an improved quadrature bandpass ΔΣ converter.

It is a further object of this invention to provide such an improved quadrature bandpass ΔΣ converter which uses a feed forward approach that has superior dynamic range, lower power and less signal distortion.

It is a further object of this invention to provide such an improved quadrature bandpass ΔΣ converter which is made more robust by avoiding the coefficient sensitivity of straightforward feed forward approaches.

The invention results from the realization that an improved quadrature bandpass ΔΣ converter with image quantization noise suppression having the feed forward advantages of superior dynamic range, lower power and less signal distortion while avoiding the attendant impractical sensitivity to coefficient errors can be achieved by providing the image resonator with its own feedback through a DAC (or DACS) from the ADC. Similarly, the feedback approach can be further improved by providing the signal resonators with their own feed forward to the ADC.

The subject invention, however, in other embodiments, need not achieve all these objectives and the claims hereof should not be limited to structures or methods capable of achieving these objectives.

This invention features an improved quadrature bandpass ΔΣ converter including a loop filter, an ADC responsive to the loop filter and a first feedback DAC responsive to the ADC. A first summing circuit is responsive to the first DAC and an analog input for providing an input to the loop filter. A second feedback DAC is responsive to the ADC for providing an input to the loop filter. The loop filter includes a plurality of signal resonators, at least one image resonator, a second summing circuit, and a feed forward circuit connecting at least two of the resonators to the second summing circuit for reducing the quantization noise from the ADC. The at least one image resonator is responsive to the second DAC for reducing the image quantization noise.

In a preferred embodiment the feed forward circuit may connect each of the resonators to the second summing circuit. The input of the image resonator may be connected with the output of at least one of the signal resonators. The loop filter may include a third summing circuit connected between the at least one image resonator and the second DAC. The output of the image resonator may not be connected to the input of a signal resonator. The signal resonators may be cascade connected and the feed forward circuit may connect each of the resonators to the second summing circuit. The image resonator may be the last resonator in the cascade. The second summing circuit may be connected to the input of the ADC. The image resonator and second DAC may be in parallel with the first DAC, first summing circuit and cascade of signal resonators. The signal resonators may be cascade connected. A third DAC may be connected to the output of the ADC and the third DAC may provide an input to a third or subsequent signal resonator via a third summing circuit in the cascade of signal resonators. The number of feedback DACs may be less than the number of resonators. The loop filter may include a plurality of intermediate summing circuits, and the paths from the ADC output through the feedback DACs and back to the ADC input established by the feed forward circuit may be such that there may exists a path which passes through exactly one resonator, another which passes through exactly two resonators, and so on up to a path which passes through all resonators.

The invention also features an improved quadrature bandpass ΔΣ converter including a loop filter, an ADC responsive to the loop filter and a first feedback DAC responsive to the ADC. A first summing circuit is responsive to the first DAC and an analog input for providing an input to the loop filter. A second feedback DAC is responsive to the ADC for providing an input to the loop filter. The loop filter includes a plurality of cascaded signal resonators, at least one image resonator, a second summing circuit providing an input to the ADC, and a feed forward circuit connecting each of the resonators to the second summing circuit for reducing the quantization noise from the ADC. The at least one image resonator is responsive to the second DAC for reducing the image quantization noise.

The invention also features an improved quadrature bandpass ΔΣ converter including a loop filter, an ADC responsive to the loop filter and a first feedback DAC responsive to the ADC. A first summing circuit is responsive to the first DAC and an analog input for providing an input to the loop filter. A second feedback DAC is responsive to the ADC for providing an input to the loop filter. The loop filter includes a plurality of cascaded signal resonators including at least one image resonator, a second summing circuit, and a third summing circuit connected between the at least one image resonator and the second DAC. A feed forward circuit connects each of the resonators to the second summing circuit for reducing the quantization noise from the ADC. The at least one image resonator is responsive to the second DAC for reducing the image quantization noise.

The invention also features an improved quadrature bandpass ΔΣ converter including a loop filter, an ADC responsive to the loop filter, a first feedback DAC responsive to the ADC and a first summing circuit responsive to the first DAC and an analog input for providing an input to the loop filter. A second feedback DAC is responsive to the ADC for providing an input to the loop filter. The loop filter includes a plurality of signal resonators, at least one image resonator, a second summing circuit, that provides an input for the image resonator and a feed forward circuit connecting the signal resonators to the second summing circuit for reducing the quantization noise from the ADC. The at least one image resonator is responsive to the second DAC for reducing the image quantization noise.

The invention also features an improved quadrature bandpass ΔΣ converter including a loop filter and an ADC responsive to the loop filter. The loop filter includes a plurality of cascaded signal resonators and an image resonator. There is a DAC associated with each resonator and there are a plurality of intermediate summing circuits one for interconnecting each DAC with its associated signal resonator. A feed forward circuit includes a third summing circuit responsive to the output of the cascaded signal resonators and the image resonator for providing an output to the ADC for reducing the quantization noise from the ADC. In a preferred embodiment the DAC associated with the image resonator may be coupled to the image resonator via a third summing circuit.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
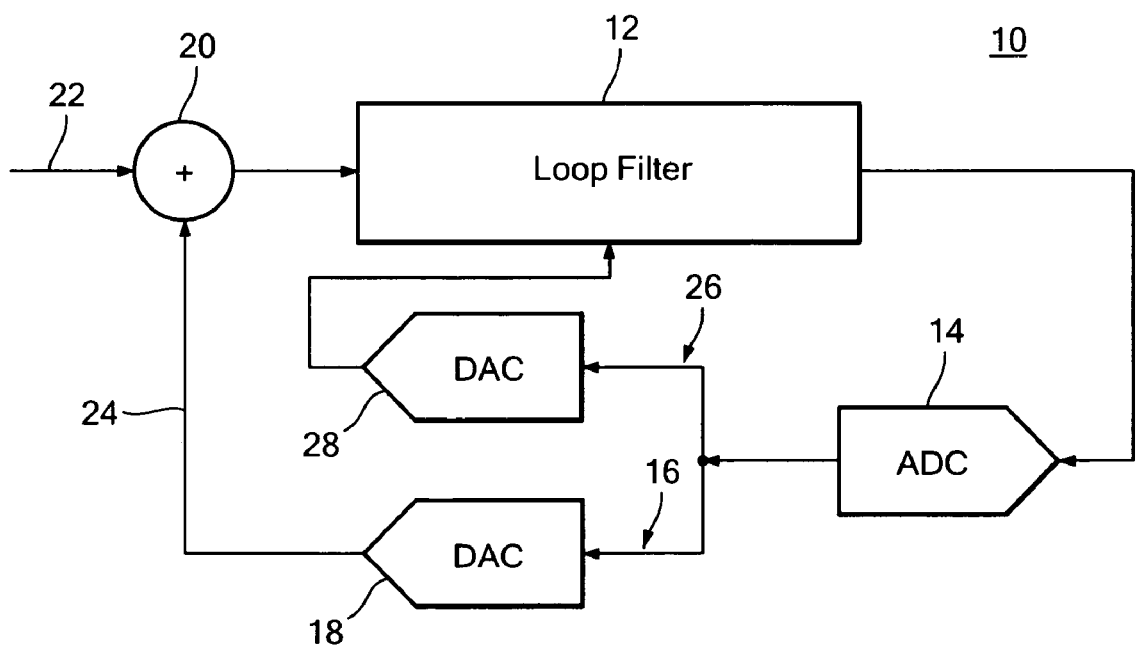
FIG. 1 is a simplified schematic diagram of an improved quadrature bandpass ΔΣ converter according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 an improved quadrature bandpass ΔΣ converter 10 according to this invention including a loop filter 12 whose output is delivered to analog to digital converter (ADC) 14. There is a first feedback path 16 through digital to analog converter (DAC) 18 to a first input summer 20 which receives an analog input signal on line 22 and a feedback signal from DAC 18 on line 24. The output from input summer 20 is delivered to loop filter 12. In accordance with this invention there is a second feedback circuit 26 from ADC 14 to loop filter 12 through DAC 28. The loop filter includes a plurality of signal resonators and an image resonator. The signal resonators are connected to a second internal summing circuit in loop filter 12 and they reduce the in-band quantization noise from the ADC 14. There is at least one image resonator in loop filter 12 which is responsive to the second DAC 28 to provide the image notch and reduce the image quantization noise as more fully explained with respect to FIGS. 2-5 following.

Figure 2:
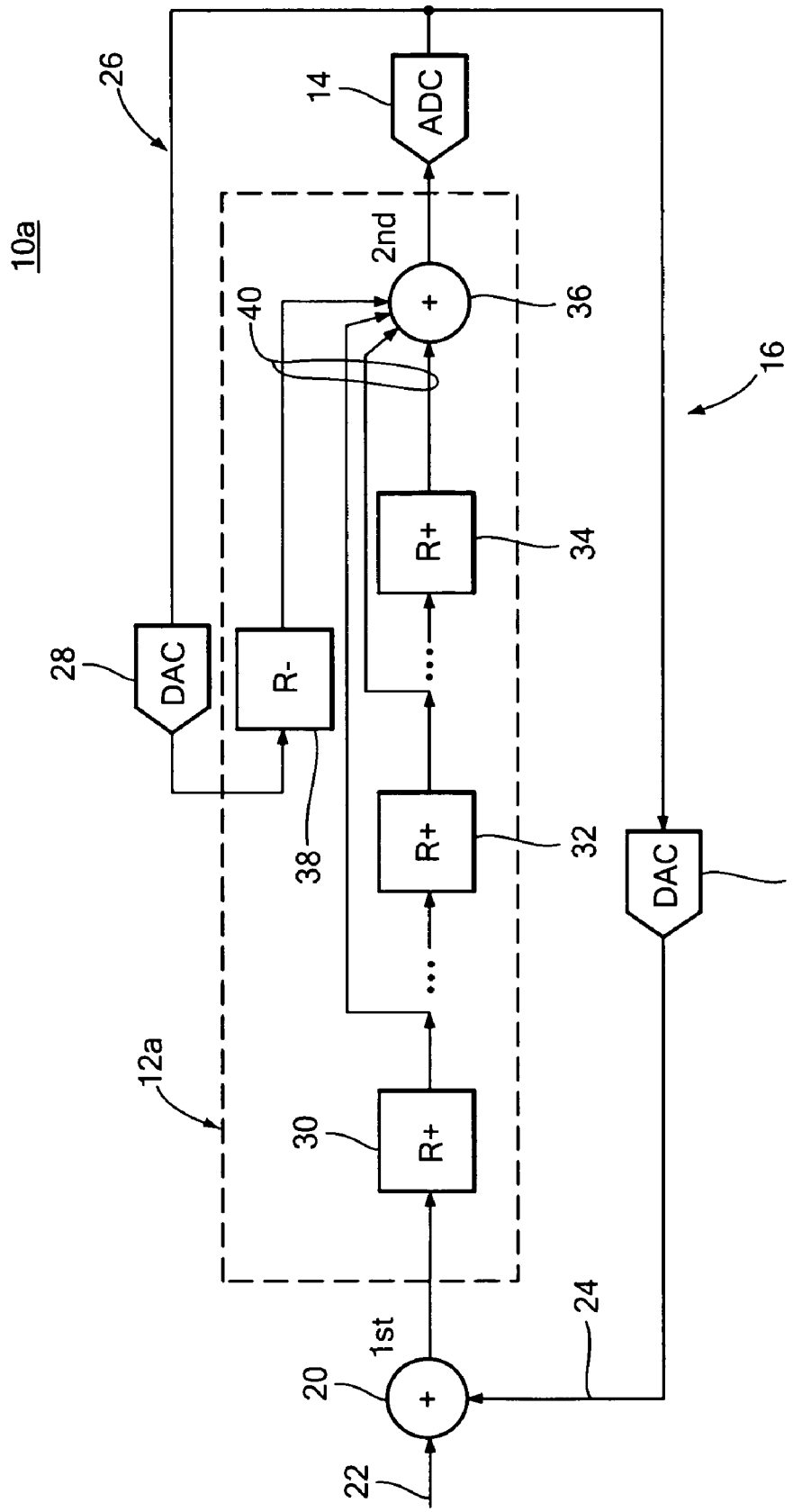
FIG. 2 is a more detailed schematic diagram of one embodiment of the improved quadrature bandpass ΔΣ converter of FIG. 1.

In one construction loop filter 12a, FIG. 2, includes a plurality of signal resonators 30, 32, and 34 which are cascade connected between the first input summing circuit 20 and the second summing circuit 36. Loop filter 12a also includes image resonator 38 connected to DAC 28. A feed forward circuit 40 connects each of the signal resonators 30, 32, and 34 and image resonator 38 to the second summing circuit 36. By providing the image resonator or resonators with its own feedback circuit through a DAC from the ADC there is gained an improved quadrature bandpass ΔΣ converter with image quantization noise suppression yet with the feed forward advantages of superior dynamic range, lower power, and less signal distortion but avoiding the attendant impractical sensitivity to coefficient errors in the summers that would normally be present. The spaced dots in FIGS. 2-5 are used to indicate that the numbers of resonators need not be restricted to that shown. In FIG. 2 the feed forward circuit connects each of the resonators to the second summing circuit and the signal resonators are cascade connected while the output of the second summing circuit is connected to the input of the ADC.

Figure 3:
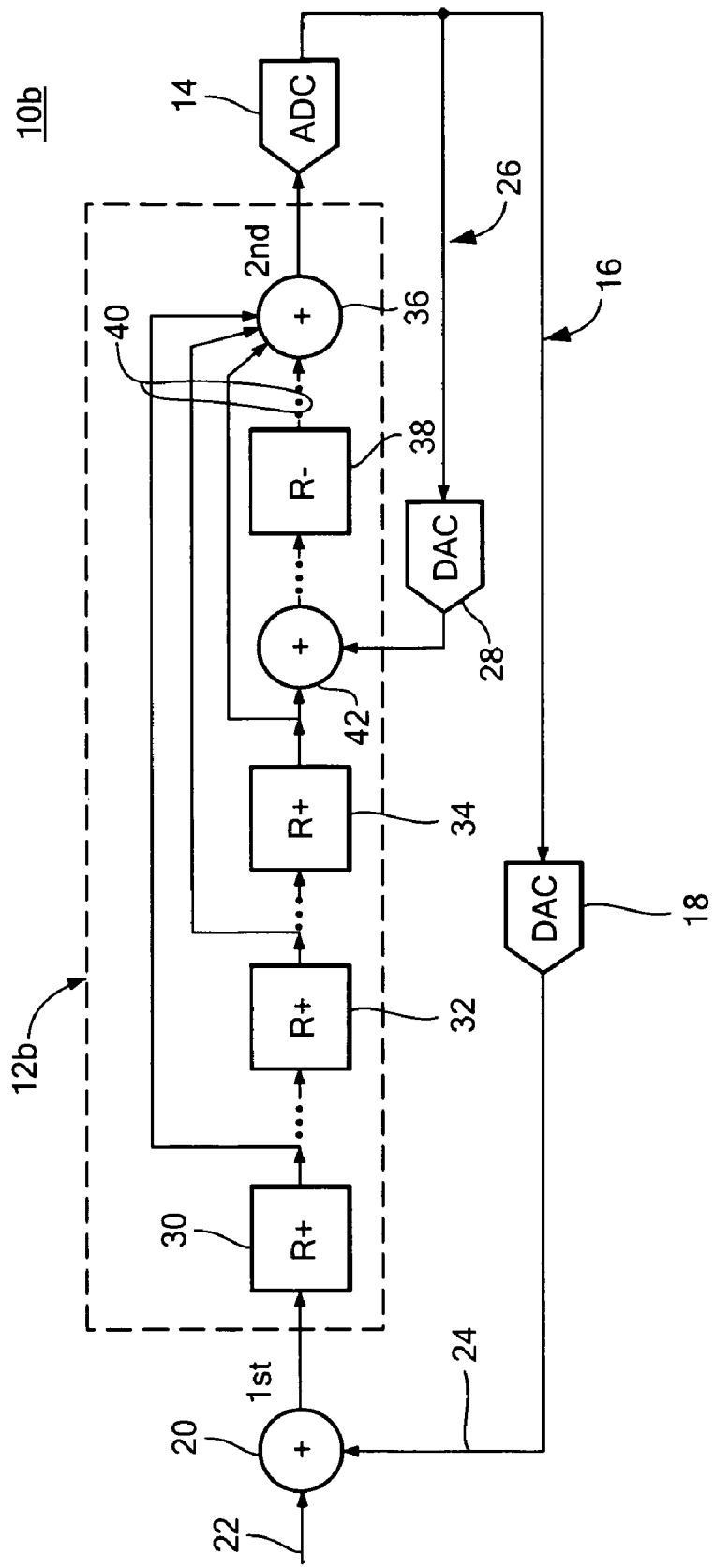
FIG. 3 is a more detailed schematic diagram of another embodiment of the improved quadrature bandpass ΔΣ converter of FIG. 1.

In another construction, FIG. 3, the signal resonators 30, 32, 34 can be cascaded with image resonator 38 using a third summing circuit 42. In FIG. 2 the image resonator and the second DAC are in parallel with the first DAC, the first summing circuit, and the cascade of signal resonators, whereas in FIG. 3 the image resonator is cascaded with the signal resonators. As shown in FIG. 3, the preferred placement of the image resonators 38 is in the final most position in the cascade.

Figure 4:
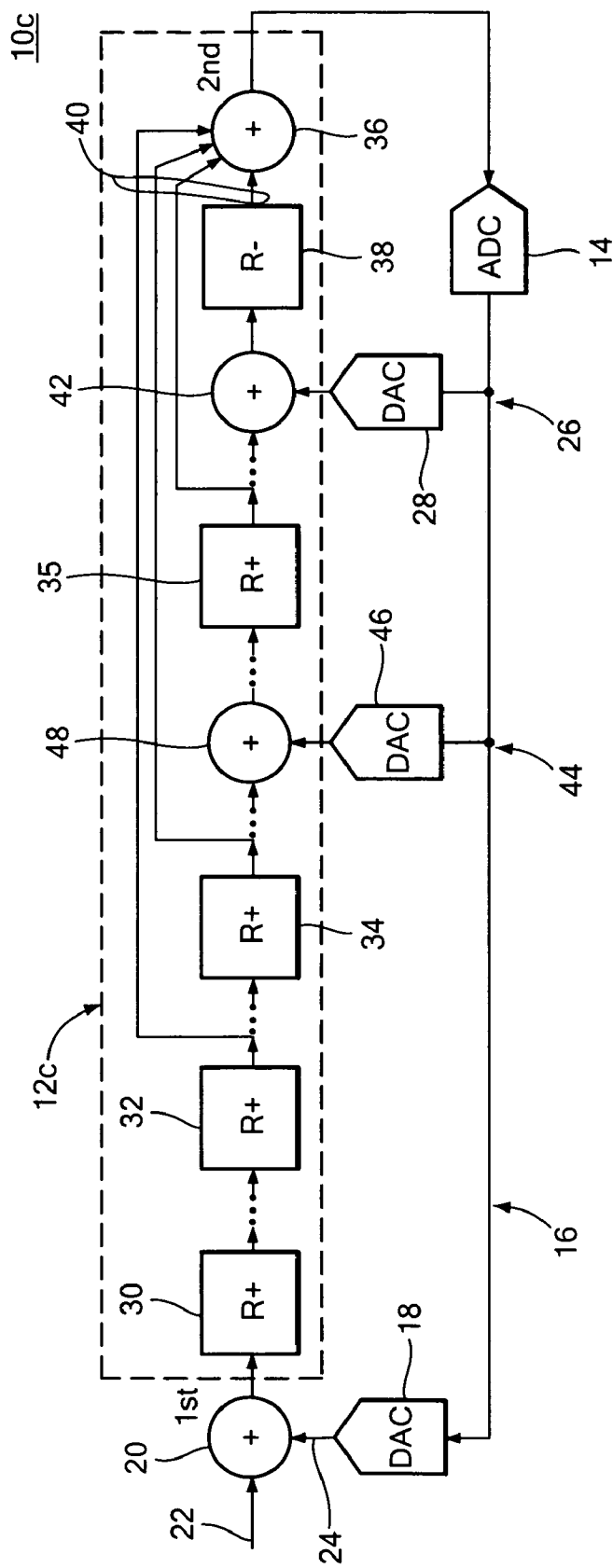
FIG. 4 is a more detailed schematic diagram of yet another embodiment of the improved quadrature bandpass ΔΣ converter of FIG. 1.
Figure 5:
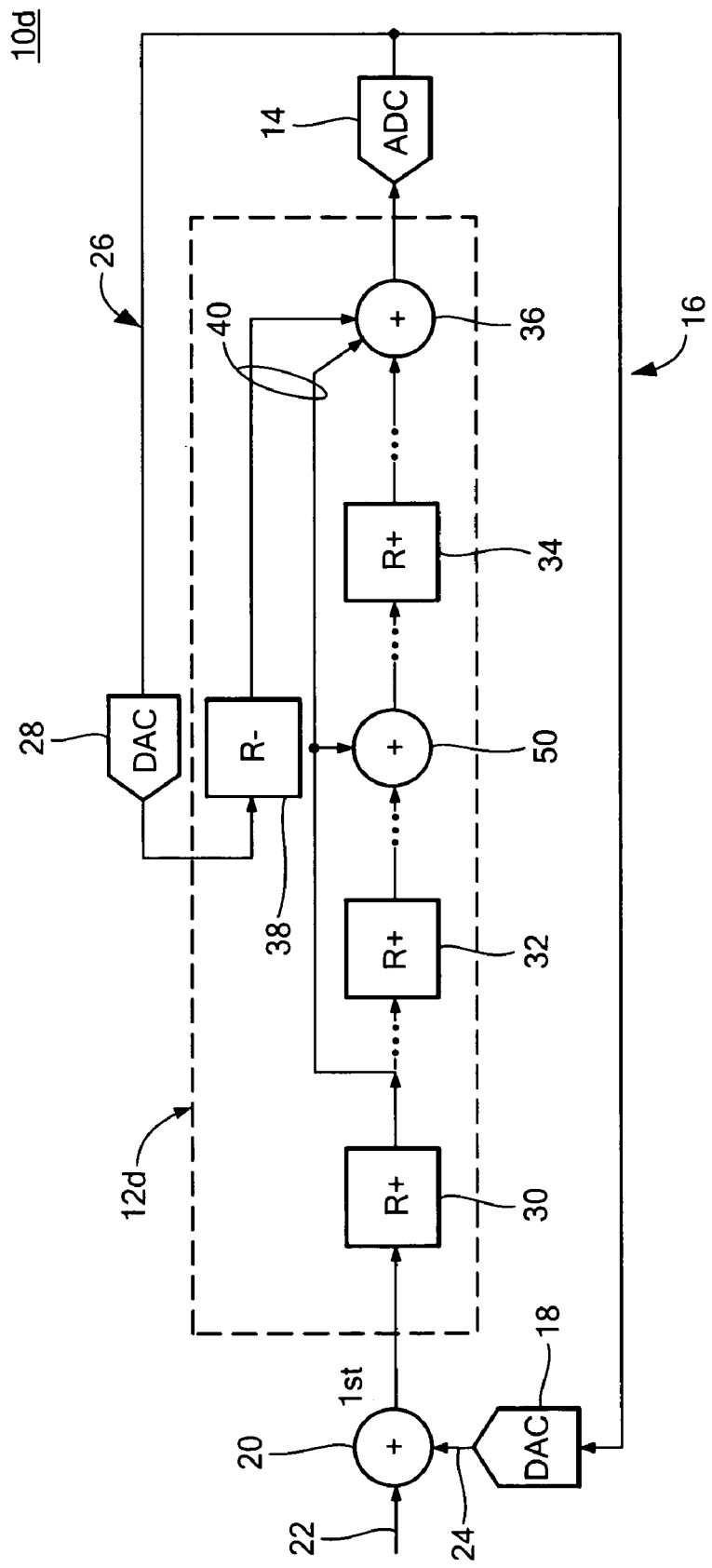
FIG. 5 is a more detailed schematic diagram of still another embodiment of the improved quadrature bandpass ΔΣ converter of FIG. 1.

Alternative constructions are usable as well. For example, as shown in FIG. 4, there may be an additional feedback circuit 44 including a third feedback DAC 46 which interconnects ADC 14 through a fourth summing circuit 48 to signal resonators 34 and 35. Additional feedback circuits with additional DACs may be connected to other of the signal resonators as desired but generally they should be connected to the input of at least a third or subsequent signal resonator in the cascade. While the feed forward circuit has been shown as connecting all of the signal resonators to the second summing circuit 36 this too is not a necessary limitation of the invention as, for example, as shown in FIG. 4 where the inclusion of DAC 46 eliminates the need to have a connection from signal resonator 30 to the second summing circuit 36. Furthermore, as shown in FIG. 5, there may be one or more intermediate summing circuits 50 with some of the resonators feeding forward to it while others feed forward to the second summing circuit 36.

Figure 6:
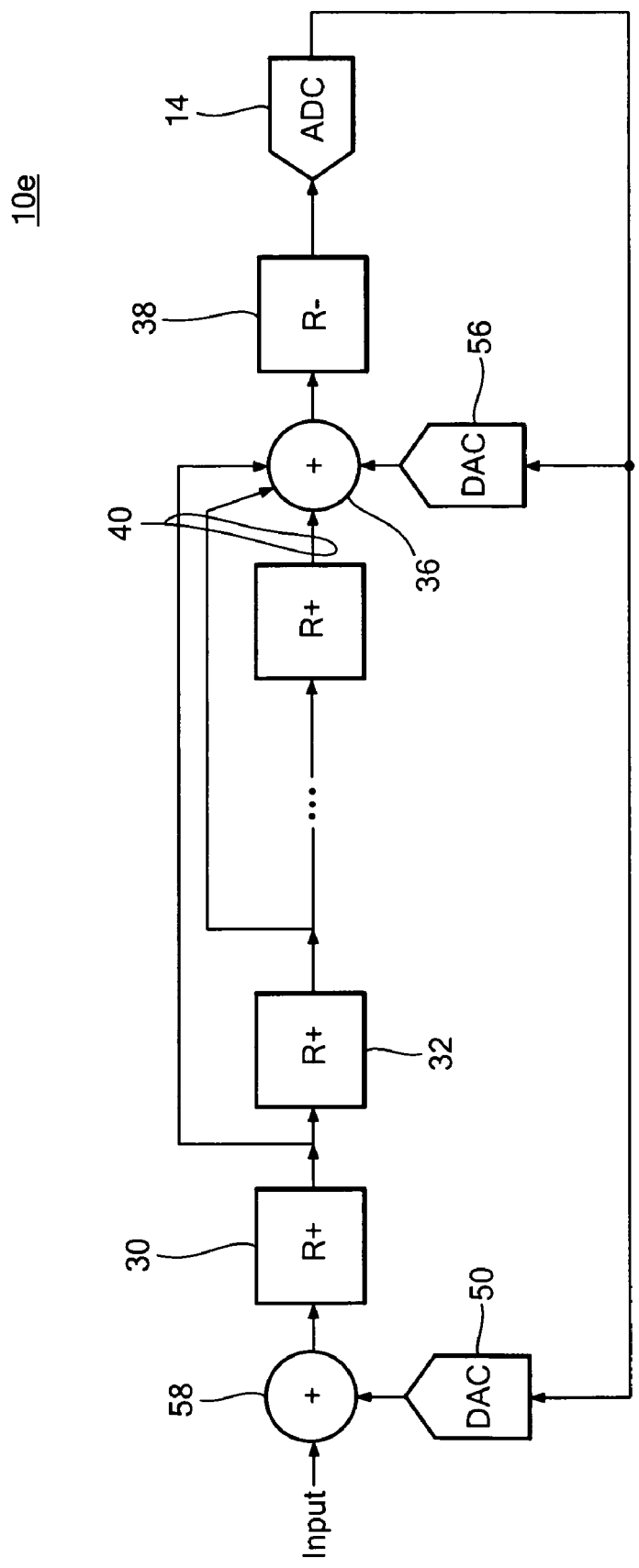
FIG. 6 is a more detailed schematic diagram of still another embodiment of the improved quadrature bandpass ΔΣ converter of FIG. 1.

In FIG. 6 each of the cascaded signal resonators through feed forward circuit 40 connect to summing circuit 36 which is connected to ADC 14 through image resonator 38. In this way the improved quadrature bandpass ΔΣ converter of this invention with image quantization noise suppression and having the feed forward advantage of superior dynamic range, lower power, and less signal distortion, can be achieved while avoiding the attendant impractical sensitivity to coefficient errors in the summers by providing the image resonator or resonators with its (or their) own feedback circuit through a DAC (or DACs) from the ADC.

For some applications, the feedback approach is desirable because it is more tolerant to out-of-band interference. Since the signal energy is attenuated by the image resonator, it can be improved by providing the signal resonators a separate feed forward to the ADC.

Figure 7:
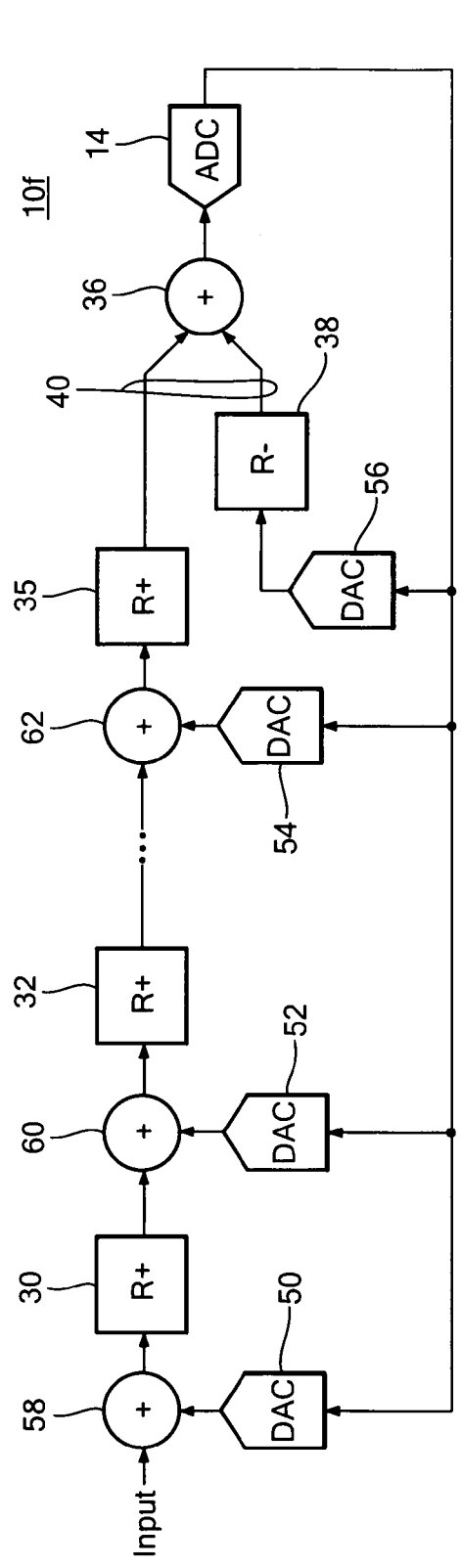
FIG. 7 is a more detailed schematic diagram of still another embodiment of the improved quadrature bandpass ΔΣ converter of FIG. 1.
Figure 8:
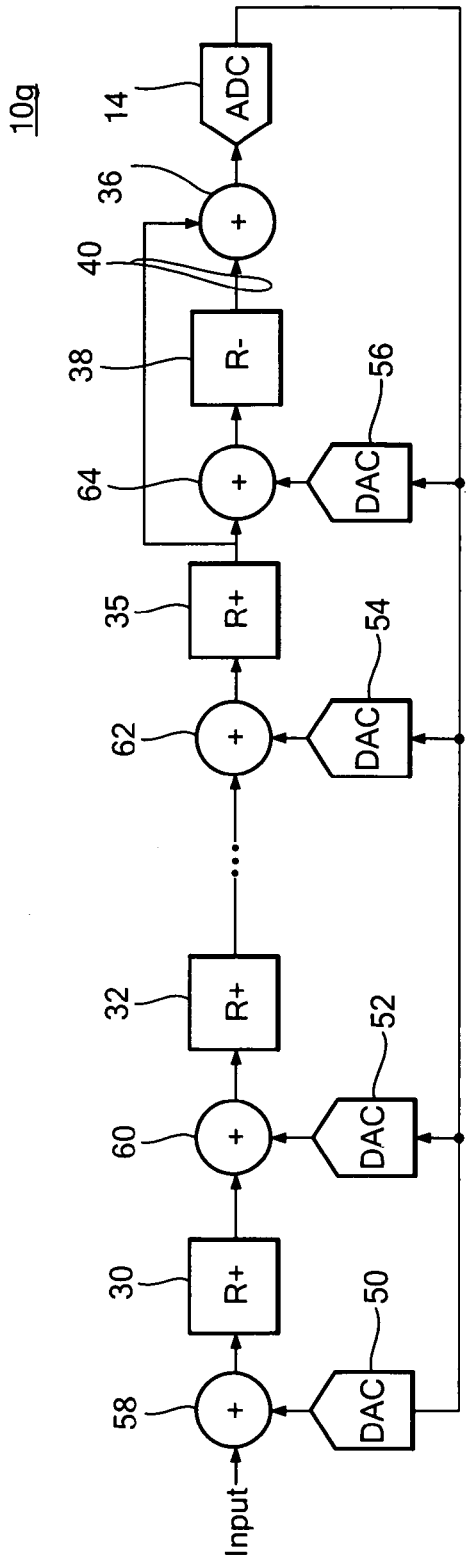
FIG. 8 is a more detailed schematic diagram of still another embodiment of the improved quadrature bandpass ΔΣ converter of FIG. 1.

In FIG. 7 each signal resonator 30-35 has a DAC 50-54 associated with it which connects via a summing circuit 58-62. Image resonator 38 is connected directly to DAC 56 and both resonators 35 and 38 connect through feed forward circuit 40 to summing circuit 36. In FIG. 8 there is an additional summing circuit 64 which couples DAC 56 and signal resonator 35 to image resonator 38 and signal resonator 35 connects to both summing circuits 64 and 36.

Thus, the number of feedback DACs may be less than the number of resonators. The loop filter may include a plurality of intermediate summing circuits. The paths from the ADC output through the feedback DACs and back to the ADC input established by the feed forward circuit are such that there exists a path which passes through exactly one resonator, another which passes through exactly two resonators, and so on up to a path which passes through all resonators.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An improved quadrature bandpass ΔΣ converter comprising:
   a loop filter;
   an ADC responsive to said loop filter;
   a first feedback DAC responsive to said ADC;
   a first summing circuit responsive to said first DAC and an analog input for providing an input to said loop filter, and
   a second feedback DAC responsive to said ADC for providing an input to said loop filter;
   said loop filter including a plurality of signal resonators, at least one image resonator, a second summing circuit, and a feed forward circuit connecting at least two of said resonators to said second summing circuit for reducing the quantization noise from said ADC, said at least one image resonator being responsive to said second DAC for reducing the image quantization noise.

2. The quadrature bandpass ΔΣ converter of claim 1 in which said feed forward circuit connects each of said resonators to said second summing circuit.

3. The quadrature bandpass ΔΣ converter of claim 1 in which the input of said image resonator is connected with the output of at least one of said signal resonators.

4. The quadrature bandpass ΔΣ converter of claim 3 in which said loop filter includes a third summing circuit connected between said at least one image resonator and said second DAC.

5. The quadrature bandpass ΔΣ converter of claim 3 in which the output of said image resonator is not connected to the input of a signal resonator.

6. The quadrature bandpass ΔΣ converter of claim 1 in which said signal resonators are cascade connected and said feed forward circuit connects each of said resonators to said second summing circuit.

7. The quadrature bandpass ΔΣ converter of claim 6 in which said image resonator is the last resonator in said cascade.

8. The quadrature bandpass ΔΣ converter of claim 7 in which said second summing circuit is connected to the input of said ADC.

9. The quadrature bandpass ΔΣ converter of claim 7 in which said image resonator and second DAC are in parallel with said first DAC, first summing circuit and cascade of signal resonators.

10. The quadrature bandpass ΔΣ converter of claim 1 in which said signal resonators are cascade connected.

11. The quadrature bandpass ΔΣ converter of claim 10 further including a third DAC connected to the output of said ADC and said third DAC provides an input to a third or subsequent signal resonator via a third summing circuit in said cascade of signal resonators.

12. The quadrature bandpass ΔΣ converter of claim 1 in which the number of feedback DACs is less than the number of resonators.

13. The quadrature bandpass ΔΣ converter of claim 12 in which said loop filter includes a plurality of intermediate summing circuits, and the paths from the ADC output through the feedback DACs and back to the ADC input established by said feed forward circuit are such that there exists a path which passes through exactly one resonator, another which passes through exactly two resonators, and so on up to a path which passes through all resonators.

14. An improved quadrature bandpass ΔΣ converter comprising:
a loop filter;
an ADC responsive to said loop filter;
a first feedback DAC responsive to said ADC;
a first summing circuit responsive to said first DAC and an analog input for providing an input to said loop filter, and
a second feedback DAC responsive to said ADC for providing an input to said loop filter;
said loop filter including a plurality of cascaded signal resonators, at least one image resonator, a second summing circuit providing an input to said ADC, and a feed forward circuit connecting each of said resonators to said second summing circuit for reducing the quantization noise from said ADC, said at least one image resonator being responsive to said second DAC for reducing the image quantization noise.

15. An improved quadrature bandpass ΔΣ converter comprising:
a loop filter;
an ADC responsive to said loop filter;
a first feedback DAC responsive to said ADC;
a first summing circuit responsive to said first DAC and an analog input for providing an input to said loop filter, and
a second feedback DAC responsive to said ADC for providing an input to said loop filter;
said loop filter including a plurality of cascaded signal resonators, including at least one image resonator, a second summing circuit, and a third summing circuit connected between said at least one image resonator and said second DAC and a feed forward circuit connecting each of said resonators to said second summing circuit for reducing the quantization noise from said ADC, said at least one image resonator being responsive to said second DAC for reducing the image quantization noise.

16. An improved quadrature bandpass ΔΣ converter comprising:
a loop filter;
an ADC responsive to said loop filter;
a first feedback DAC responsive to said ADC;
a first summing circuit responsive to said first DAC and an analog input for providing an input to said loop filter, and
a second feedback DAC responsive to said ADC for providing an input to said loop filter;
said loop filter including a plurality of signal resonators, at least one image resonator, a second summing circuit, that provides an input for the image resonator and a feed forward circuit connecting said signal resonators to said second summing circuit for reducing the quantization noise from said ADC, said at least one image resonator being responsive to said second DAC for reducing the image quantization noise.

17. An improved quadrature bandpass ΔΣ converter comprising:
a loop filter;
an ADC responsive to said loop filter;
said loop filter including a plurality of cascaded signal resonators and an image resonator; a DAC associated with each said resonator; a plurality of intermediate summing circuits one for interconnecting each DAC with its associated signal resonator; and
a feed forward circuit including a third summing circuit responsive to the output of said cascaded signal resonators and said image resonator for providing an output to said ADC for reducing the quantization noise from said ADC.

18. The improved quadrature bandpass ΔΣ converter of claim 16 in which the DAC associated with said image resonator is coupled to said image resonator via a third summing circuit.

* * * * *